(12) United States Patent
Topacio et al.

(10) Patent No.: US 7,994,044 B2
(45) Date of Patent: Aug. 9, 2011

(54) SEMICONDUCTOR CHIP WITH CONTOURED SOLDER STRUCTURE OPENING

(75) Inventors: Roden R. Topacio, Markham (CA); Neil McLellan, Toronto (CA)

(73) Assignee: ATI Technologies ULC, Markham (CA)

( * ) Notice: Subject to any disclaimer, the term of this patent is extended or adjusted under 35 U.S.C. 154(b) by 23 days.

(21) Appl. No.: 12/553,336

(22) Filed: Sep. 3, 2009

(65) Prior Publication Data

US 2011/0049725 A1    Mar. 3, 2011

(51) Int. Cl.
 *H01L 21/44* (2006.01)
 *H01L 23/12* (2006.01)

(52) U.S. Cl. ............... 438/612; 257/704; 257/E21.509; 257/E23.01

(58) Field of Classification Search .................. 257/773, 257/678, 686, E21.509, E23.01, E23.023; 438/121, 106, 108, 612; 700/121, 262
See application file for complete search history.

(56) References Cited

U.S. PATENT DOCUMENTS

| | | | | |
|---|---|---|---|---|
| 3,615,913 | A * | 10/1971 | Shaw | 148/33.3 |
| 5,869,869 | A * | 2/1999 | Hively | 257/355 |
| 6,459,150 | B1 * | 10/2002 | Wu et al. | 257/724 |
| 6,736,306 | B2 * | 5/2004 | Byun et al. | 228/180.22 |
| 2006/0108676 | A1 * | 5/2006 | Punzalan et al. | 257/686 |

OTHER PUBLICATIONS

Guotao Wang et. al.; *Chip packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06; IEEE; 2006; pp. 1595-1603.
National Electronics Center of Excellence; *Empfasis-Lead Free Solding for Sustainment*; A publication of the National Electronics Manufacturing Center for Excellence; http://www.empf.org/empfasis/oct03/3403pbsustain.html; Mar./Apr. 2003; pp. 1-3.
K.C. Norris et al.; *Reliability of Controlled Collapse Interconnections*; IBM J. Res. Development; May 1969; pp. 1-6.
Werner Engelmaier; *Solder Joints in Electronics: Design for Reliability*; 1999; pp. 1-13.

* cited by examiner

*Primary Examiner* — Thomas L Dickey
*Assistant Examiner* — Nikolay Yushin
(74) *Attorney, Agent, or Firm* — Timothy M. Honeycutt

(57) ABSTRACT

Methods and apparatus to inhibit cracks and delaminations in a semiconductor chip solder bump are disclosed. In one aspect, a method of manufacturing is provided that includes forming a first dielectric layer over a first conductor structure of a semiconductor chip and forming a first opening in the first dielectric layer to expose at least a portion of the conductor structure. The first opening defines an interior wall that includes plural protrusions. A solder structure is coupled to the first conductor structure such that a portion of the solder structure is positioned in the first opening.

20 Claims, 5 Drawing Sheets

SEMICONDUCTOR CHIP WITH CONTOURED SOLDER STRUCTURE OPENING

BACKGROUND OF THE INVENTION

1. Field of the Invention

This invention relates generally to semiconductor processing, and more particularly to methods and apparatus for coupling a solder structure to a semiconductor chip input/output site.

2. Description of the Related Art

Flip-chip mounting schemes have been used for decades to mount semiconductor chips to circuit boards, such as semiconductor chip package substrates. In many conventional flip-chip variants, a plurality of solder joints are established between input/output (I/O) sites of a semiconductor chip and corresponding I/O sites of a circuit board. In one conventional process, a solder bump is metallurgically bonded to a given I/O site or pad of the semiconductor chip and a so-called pre-solder is metallurgically bonded to a corresponding I/O site of the circuit board. Thereafter the solder bump and the pre-solder are brought into proximity and subjected to a heating process that reflows one or both of the solder bump and the pre-solder to establish the requisite solder joint.

In one conventional process, the connection of the solder bump to a particular I/O site of a semiconductor chip entails forming an opening in a top-level dielectric film of a semiconductor chip proximate the I/O site and thereafter depositing metal to establish an under bump metallization (UBM) structure. The solder ball is then metallurgically bonded to the UBM structure by reflow. The opening in the dielectric film is shaped with relatively planar sidewalls, that is, without any protrusions or projections. One conventional example uses an octagonal opening. The later formed UBM structure has an interior wall that matches the planar sidewall configuration of the dielectric opening.

Flip-chip solder joints may be subjected to mechanical stresses from a variety of sources, such as coefficient of thermal expansion mismatches, ductility differences and circuit board warping. Such stresses can lead to crack propagation in the solder joint, particularly at the intermetallic interface between the UBM structure and the solder bump. In the conventional variant just described where the dielectric opening has a planar interior wall, cracks can propagate across the relatively open expanse between opposing or adjacent sidewalls of the UBM structure. Unimpeded crack propagation can lead to solder delamination and joint failure.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a first dielectric layer over a first conductor structure of a semiconductor chip and forming a first opening in the first dielectric layer to expose at least a portion of the conductor structure. The first opening defines an interior wall that includes plural protrusions. A solder structure is coupled to the first conductor structure such that a portion of the solder structure is positioned in the first opening.

In accordance with another aspect of an embodiment of the present invention, a method of coupling a semiconductor chip to a circuit board is provided that includes placing a portion of a first solder structure in a first opening in a first dielectric layer of the semiconductor chip. The first opening leads to at least a portion of a first conductor structure of the semiconductor chip and defines an interior wall that includes plural protrusions. The first solder structure is coupled to the circuit board.

In accordance with another aspect of an embodiment of the present invention, an apparatus is provided that includes a semiconductor chip that has a first conductor structure and a first dielectric layer on the a first conductor structure. The first dielectric layer includes a first opening to the first conductor structure that defines an interior wall of the first dielectric layer that has plural protrusions. A solder structure is coupled to the first conductor structure such that a portion of the solder structure is positioned in the first opening.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip are described herein. One example includes solder bump connection structures, such as UBM structures, fabricated at least partially in contoured openings in a dielectric film. A contoured opening in the dielectric film for a given UBM site defines an interior wall with plural protrusions. The plural protrusions create barriers to crack propagation across the intermetallic interface between the UBM structure and the solder bump. Additional details will now be described.

Figure 1:
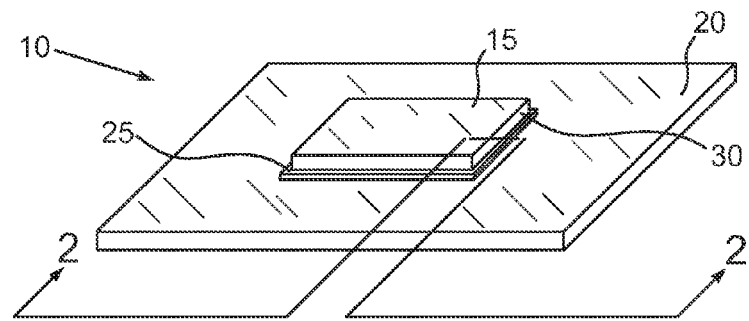
FIG. 1 is a pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 mounted on a circuit board 20. An underfill material layer 25 is positioned between the semiconductor chip 15 and the circuit board 20. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor on insulator materials, such as silicon-on-insulator materials. The semiconductor chip 15 may be flip-chip mounted to the circuit board 20 and electrically connected thereto by solder joints or other structures (not visible).

The circuit board 20 may be a semiconductor chip package substrate, a circuit card, or virtually any other type of printed circuit board. A variety of forms may used. One illustrative embodiment utilizes a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. A monolithic structure of the foregoing materials could be used for the circuit board 20 if desired.

The circuit board 20 is provided with a number of conductor traces and vias and other structures in order to provide power, ground and signals transfers between the semiconductor chip 15 and another circuit device that is not shown. To facilitate those transfers, the carrier substrate may be provided with input/outputs in the form of a pin grid array, a ball grid array, a land grid array or other type of interconnect scheme.

Additional details of the semiconductor chip 15 will be described in conjunction with FIG. 2, which is a sectional view of FIG. 1 taken at section 2-2. Before turning to FIG. 2, it will be helpful to note the exact location of the portion of the package 10 that will be shown in section. Note that section 2-2 passes through a small portion of the semiconductor chip 15 that includes an edge 30. With that back drop, attention is now turned to FIG. 2. As noted above, the semiconductor chip 15 may be configured as a bulk semiconductor or a semiconductor-on-insulator configuration. In this illustrative embodiment, the semiconductor chip 15 is implemented as bulk semiconductor that includes a bulk semiconductor layer 35, and a semiconductor device layer 40. The semiconductor device layer 40 includes the various circuits that provide the functionality for the semiconductor chip 15 and will typically include plural metallization and/or other types of conductor layers that facilitate the transfer of power ground and signals to and from the chip 15. A dielectric laminate layer 45 is formed on the semiconductor device layer 40 and may consist of multiple layers of insulating material. More details regarding the dielectric laminate 45 will be described in conjunction with a subsequent figure. The semiconductor chip 15 may be flip-chip mounted to the circuit board 20 and electrically connected thereto by way of a plurality of solder joints, two of which are visible and labeled 50 and 55 respectively. Only a portion of the solder joint 55 is visible due to the positioning of section 2-2.

The following description of the solder joint 50 will be illustrative of the other solder joints as well. The solder joint 50 includes a solder bump 60 that is metallurgically bonded to another solder structure 65 that is sometimes referred to as a pre-solder. The solder bump 60 and the pre-solder 65 are metallurgically joined by way of a solder re-flow process. The irregular line 70 denotes the hypothetical border between the solder bump 60 and pre-solder 65 following the re-flow. However, the skilled artisan will appreciate that such a border 70 is seldom that readily visible even during microscopic examination. The solder bump 60 may be composed of various lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The pre-solder 65 may be composed of the same types of materials. Optionally, the pre-solder 65 may be eliminated in favor of a single solder structure or a solder plus a conducting post arrangement. The solder bump 60 is metallurgically connected to a conductor structure or 75 that is alternatively termed an underbump metallization or UBM structure. The UBM structure 75 is, in turn, electrically connected to another conductor structure or pad in the chip 15 that is labeled 80 and may be part of the plural metallization layers in the semiconductor chip 15. The conductor 80 may be termed a redistribution layer or RDL structure. The conductor or pad 80 may be used as an input/output site for power, ground or signals or may be used as a dummy pad that is not electrically tied to other structures. The pre-solder 65 is similarly metallurgically bonded to a conductor 85 that surrounded laterally by a solder mask 90 applied to the circuit board 20. The conductor structure 85 forms part of what may be multiple layers of conductor structures and interconnected by vias and surrounded by dielectric material layers.

The underfill material layer 25 is dispersed between the semiconductor chip 15 and the circuit board 20 to reduce the effects of differences in the coefficients of thermal expansion of the semiconductor chip 15, the solder joints 50, 55 etc. and the circuit board 20. The underfill material layer 25 may be, for example, an epoxy resin mixed with silica fillers and phenol resins, and deposited before or after the re-flow process to establish the solder joints 50 and 55.

A variety of physical processes may lead to significant stresses on the intermetallic bond between the solder bump 60 and the UBM structure 75. Some of these stresses are due to differences in strain rate between the semiconductor chip 15, the circuit board 20 and the underfill material layer 25 during thermal cycling. Another contributor to the differential stresses may be ductility differences between the solder bump 60 and the pre-solder 65. Due to a phenomena known as edge effect, these differential stresses and resultant strains may be greatest proximate the edge 30 of the semiconductor chip 15 and may progressively lessen in the direction indicated by the arrow 100 projecting away from the edge 30 and towards the center of the semiconductor chip 15.

Figure 2:
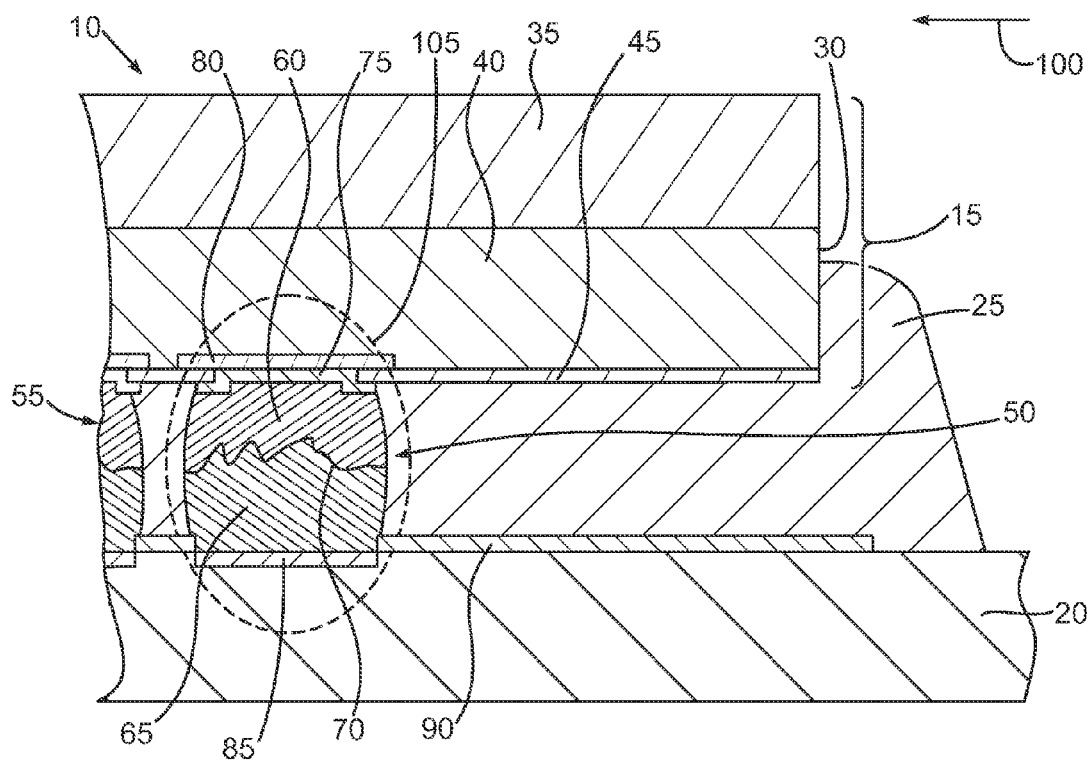
FIG. 2 is a sectional view of FIG. 1 taken at section 2-2.
Figure 3:
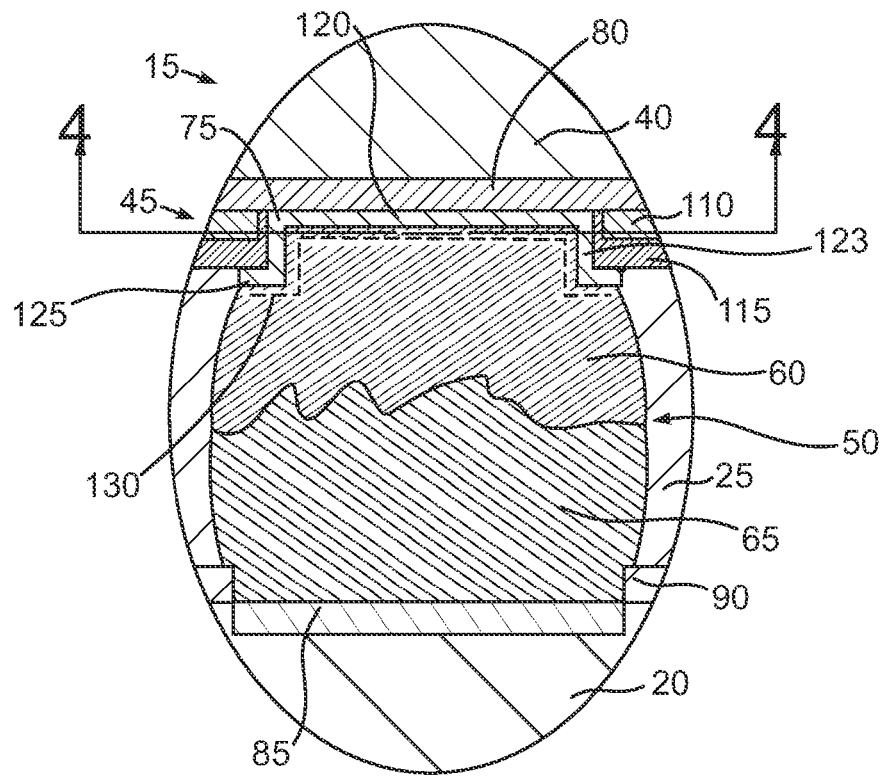
FIG. 3 is a portion of FIG. 2 shown at greater magnification.

The portion of FIG. 2 circumscribed by the dashed oval 105 will be shown in greater magnification and described in further detail in conjunction with FIG. 3. Attention is now turned to FIG. 3. Note that a small portion of the circuit board 20, the underfill material 25, and the semiconductor device layer 40 of the semiconductor chip 15 are visible. The conductor pad or structure 85 of the circuit board 20, the UBM structure 75 and a portion of the solder mask 90 are visible. Only a portion of the RDL structure 80 is visible. As noted above, the dielectric material laminate 45 may consist of multiple layers of insulating material. In this illustrative embodiment, the dielectric laminate layer 45 may consist of a passivation stack 110 and a polymeric cushion layer 115. The passivation stack 110 may consist of plural layers of passivation material, such as, for example, alternating layers of silicon dioxide and silicon nitride. The polymeric material layer 115 may consist of polyimide, benzocyclobutene or the like, or other insulating materials such as silicon nitride or the like. The UBM structure 75 may be fabricated with a base portion 120 that includes a sidewall 123 that transitions to a vertically displaced flange portion 125. The flange portion 125 may seat on the polymeric material layer 115 as shown.

The conductors 75, 80 and 85 may be composed of a variety of conductor materials, such as aluminum, copper, silver, gold, titanium, refractory metals, refractory metal compounds, alloys of these or the like. In lieu of unitary structures, the conductors 75, 80 and 85 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductors 75, 80 and 85. Various well-known techniques for applying metallic materials may be used, such as physical vapor deposition, chemical vapor deposition, plating or the like. It should be understood that additional conductor structures could be used.

Figure 4:
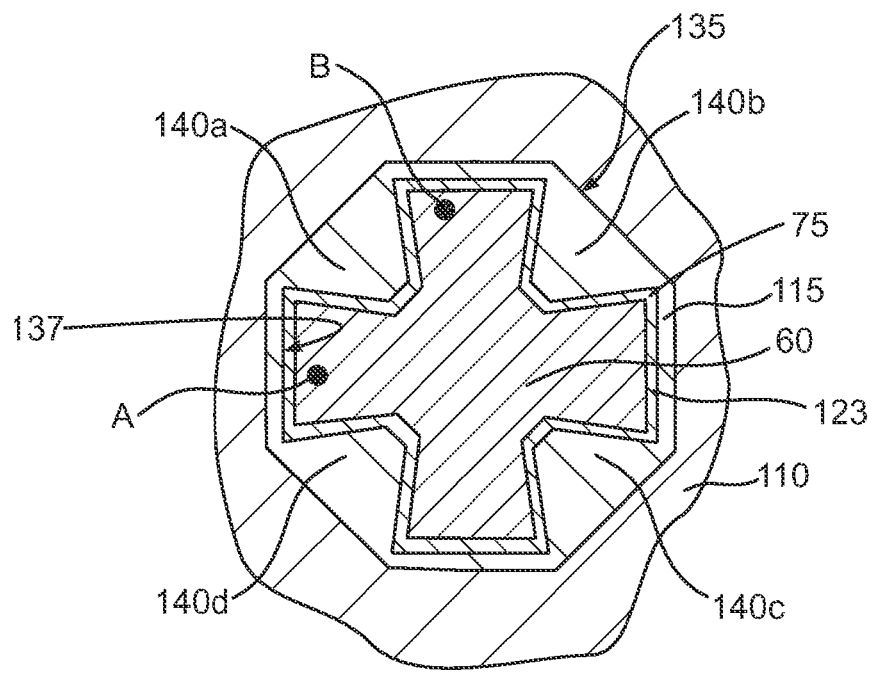
FIG. 4 is a sectional view of FIG. 3 taken at section 4-4.

As noted elsewhere herein, the solder joint 50 may be subjected to significant strains that can impact the integrity of the intermetallic interface denoted by the dashed line 130 between the solder bump 60 and the UBM structure 75. If a fracture occurs near the intermetallic interface 130, and the types of strains associated with the thermal cycling or other types of stresses continue, a delamination of the solder bump 60 from the UBM structure 75 can occur. However, the illustrative embodiments disclosed herein provide for a higher strength and more strain resistant intermetallic interface 130. Additional details of the structure of the UBM structure 75 and the adjacent material layers may be understood by referring now to FIG. 4, which is a sectional view of FIG. 3 taken at section 4-4. Note that the passivation laminate 110, the polymeric material layer 115, the sidewall 123 of the UBM structure 75 and a portion of the solder bump 60 are visible. The polymeric material layer 115 may be extend into an octagonal opening 135 in the passivation laminate 110 as shown. The actual configuration of the opening 135 may be subject to great variation. However, and unlike a conventional configuration to be discussed in more detail below, in this illustrative embodiment the polymeric material layer 115 does not have an octagonal or other configuration that matches the configuration of the opening 135. Rather, the polymeric material layer 115 is fabricated with an interior wall 137 that includes plural protrusions 140a, 140b, 140c and 140d that provide a contoured interior profile. The vertical wall 123 of the UBM structure 75 tracks this contoured interior profile. In this way, many avenues for crack propagation are cut off by the contoured internal profile. For example, a crack originating proximate point A but propagating toward point B will be prevented from complete propagation by way of the inwardly projecting protrusion 140a. In this illustrative embodiment, the protrusions 140a, 140b, 140c and 140d may have a generally trapezoidal shape. However, it should be understood that the number and shape of the protrusions 140a, 140b, 140c and 140d can be varied.

Figure 5:
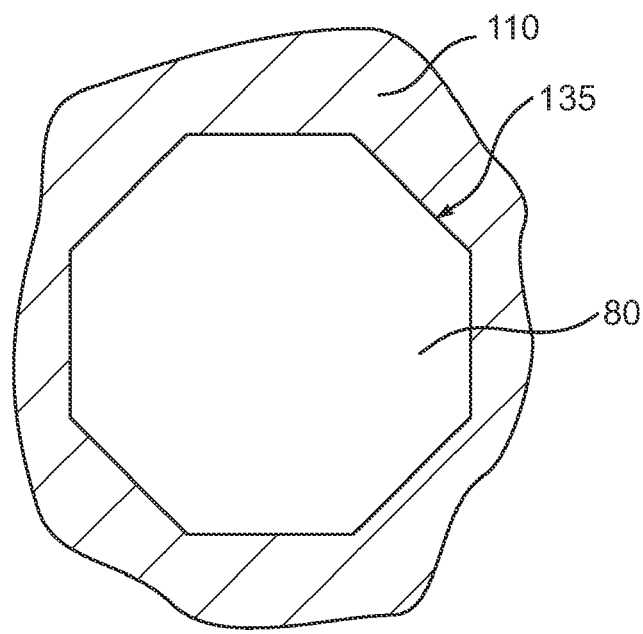
FIG. 5 is a sectional view like FIG. 4, but depicting exemplary processing to establish an opening in a dielectric structure.
Figure 6:
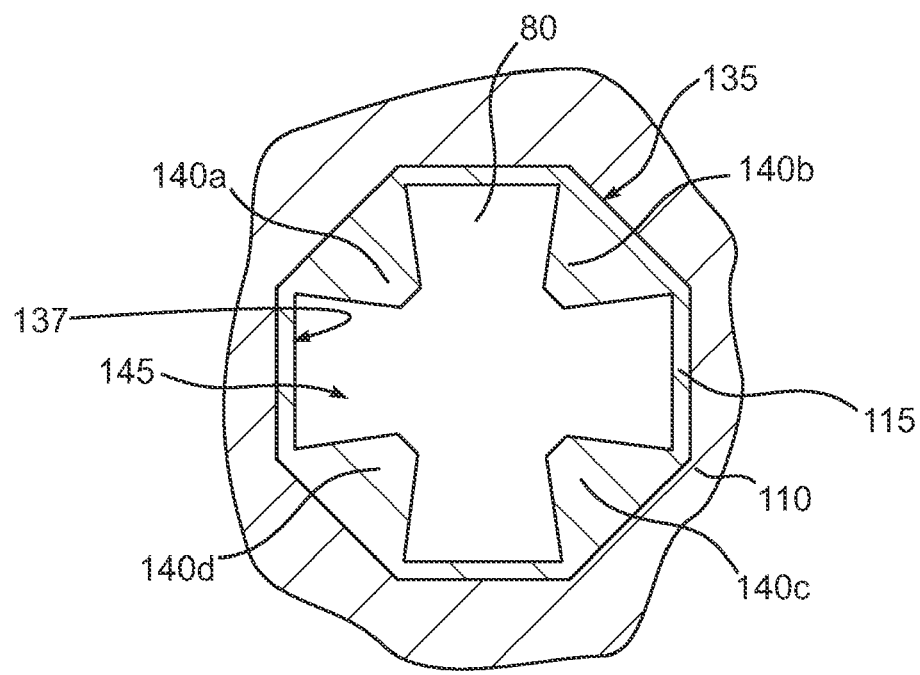
FIG. 6 is a sectional view like FIG. 5, but depicting exemplary processing to form another dielectric layer with an opening defining an interior wall with protrusions.
Figure 7:
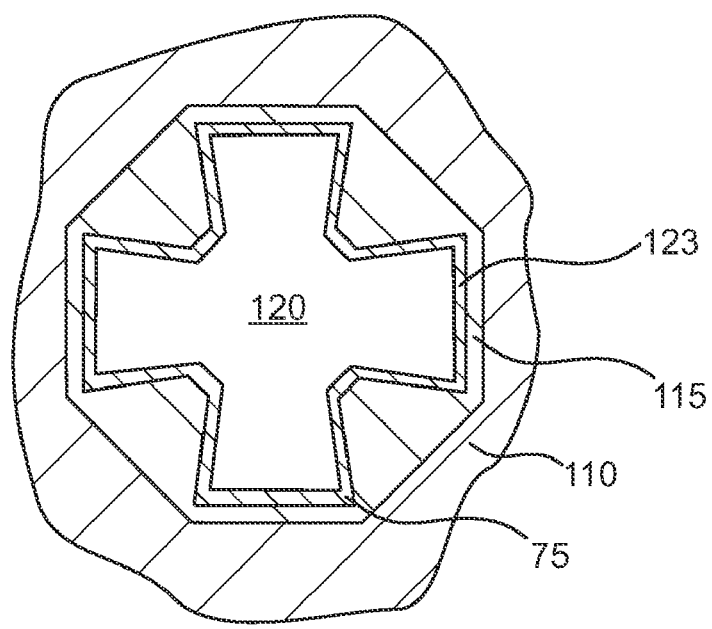
FIG. 7 is a sectional view like FIG. 6, but depicting exemplary processing to form a conductor structure in the opening.

An exemplary method for fabricating the contoured polymeric material layer and UBM structure may be understood by referring now to FIGS. 5, 6 and 7 and initially to FIG. 5. FIG. 5 is a sectional view like FIG. 4, but at an earlier stage of processing. In this regard, FIG. 5 shows the passivation laminate 110 following the formation of the opening 135 therein to reveal the underlying RDL pad 80. The opening 135 may be formed by well-known lithographic patterning techniques or laser oblation or other material removal techniques as desired. In this illustrative embodiment, the opening 135 may be formed with an octagonal footprint. However, a myriad of different shapes may be used if desired. Referring now to FIG. 6, the polymeric material layer 115 is formed over the passivation laminate 110 (visible in FIG. 3) and subsequently lithographically or otherwise patterned to produce an opening 145 that defines the interior wall 137 with the aforementioned protrusions 140a, 140b, 140c and 140d. The polymeric material layer 115 may be deposited by spin coating, chemical vapor deposition or other deposition processes. The contoured opening 145 remains after the patterning of the polymeric material layer 115 to expose a portion of the RDL pad 80.

As shown in FIG. 7, the UBM structure 75 may be formed with the side wall 123 tracking the interior contours of the polymeric material layer 115 and the base 120 seated on the RDL pad which is no longer visible. The extent of the UBM structure 75 relative to the passivation laminate 110 is more clearly visible in FIGS. 2 and 3. At this point, the solder bump 60 depicted in FIGS. 2 and 3 may be secured to the UBM structure 75 and the solder joint 50 depicted in FIGS. 2 and 3 may be made up as described generally elsewhere herein.

Figure 8:
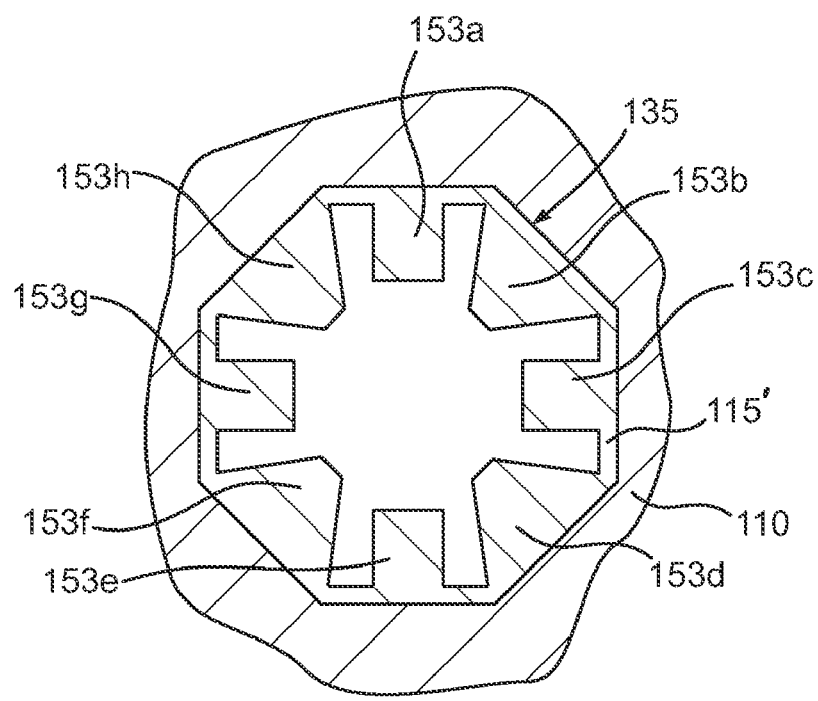
FIG. 8 is a sectional view like FIG. 6, but depicting an alternate exemplary embodiment of a dielectric layer with a contoured opening.

The skilled artisan will appreciate that the shape of the contoured profile of the polymeric material layer 115 may be subject to great variety. In the embodiment depicted in FIGS. 1, 2, 3, 4, 5, 6 and 7, the polymeric material layer 115 has plural protrusions 140a, 140b, 140c and 140d that provide a generally cross-shaped interior profile. The protrusions of the any of the disclosed embodiments may be virtually any shape. However, FIG. 8 depicts an alternate exemplary embodiment, which is a sectional view like FIG. 6. In this illustrative embodiment, a suitable opening 135 may be formed in the passivation laminate 110 as generally described elsewhere herein. The polymeric material layer 115' may be configured with a more complex interior contour that has plural protrusions 153a, 153b, 153c, 153d, 153e, 153f, 153g and 153h of varying shapes. Again, a technical objective is to reduce the number of unimpeded crack propagation pathways.

Figure 9:
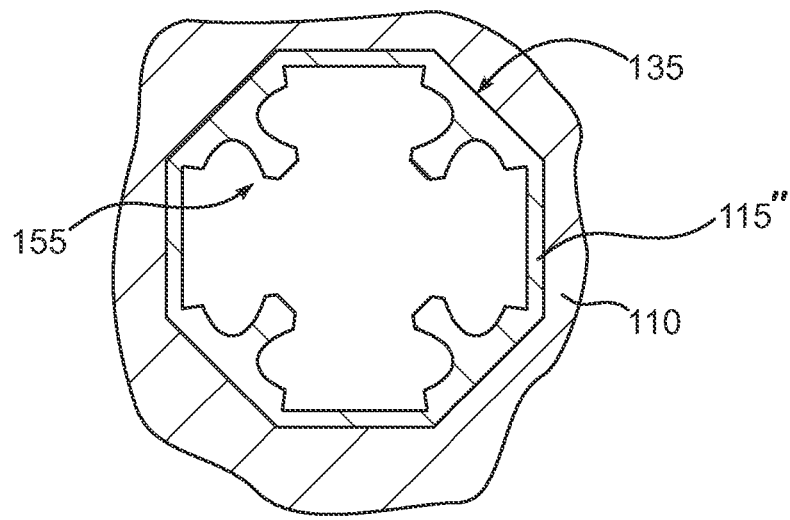
FIG. 9 is a sectional view like FIG. 8, but depicting another alternate exemplary embodiment of a dielectric layer with a contoured opening.

Another alternate exemplary embodiment of a polymeric material layer suitable for the solder joint formation may be understood by referring now to FIG. 9, which is a sectional view like FIG. 8. In this illustrative embodiment, the passivation laminate 110 may have an opening 135 in which the polymeric material layer 115" may be formed with a complex interior profile 155 that consists of plural protrusions of complex shapes that are again designed to reduce the number of crack propagation pathways.

Figure 10:
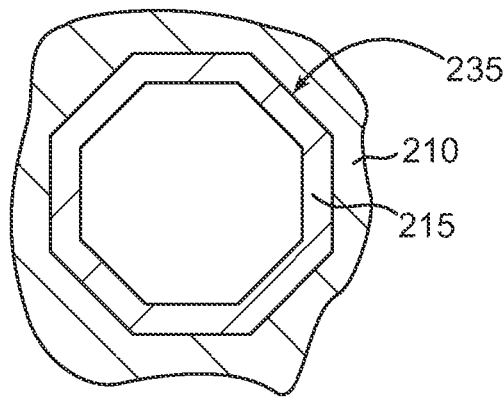
FIG. 10 is a sectional view like FIG. 7, but depicting a conventional dielectric layer and opening formation.
Figure 11:
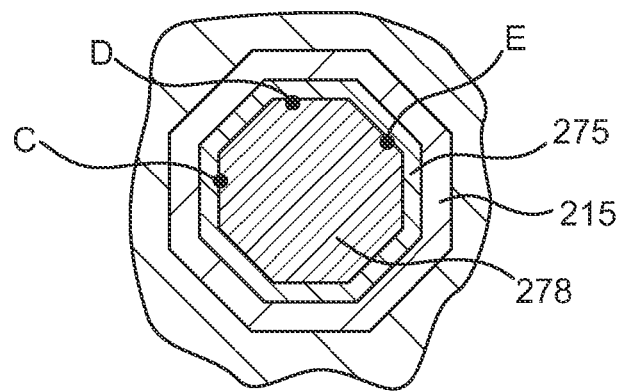
FIG. 11 is a sectional view like FIG. 10, but depicting the aftermath of a conventional solder bump deposition in the opening.

It may be helpful at this juncture to contrast the embodiments disclosed herein with a conventional pattern for a polymeric material layer used for a solder joint. In this regard, attention is turned to FIGS. 10 and 11, which are sectional views like FIGS. 6 and 7. FIG. 10 shows a conventional dielectric laminate 210 with an opening 235 formed therein to accommodate a polymeric material layer 215. Note how the conventional polymeric material layer 215 has an internal profile which tracks the generally octagonal shape of the opening 235 in the dielectric laminate 210. Referring now to FIG. 11, once the UBM structure 275 is formed within the polymeric material layer 215, and the solder bump 278 is formed within the contours of the conventional polymeric material layer 215, there are no protrusions to impede the propagation of cracks from, for example, points C to D or C to E, etc.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a first dielectric layer over a first conductor structure of a semiconductor chip; and
   forming a first opening in the first dielectric layer to expose at least a portion of the first conductor structure, the first opening defining an interior wall that includes plural protrusions.

2. The method of claim 1, comprising forming the first dielectric layer on a second dielectric layer that includes a second opening such that the first opening projects through the second opening.

3. The method of claim 1, comprising coupling a solder structure to the first conductor structure such that a portion of the solder structure is positioned in the first opening.

4. The method of claim 3, comprising coupling the solder structure to a circuit board.

5. The method of claim 4, wherein the coupling of the solder structure comprises forming a second conductor structure on the first conductor structure and coupling the solder structure to the second conductor structure.

6. The method of claim 1, wherein the first conductor structure comprises a dummy pad.

7. The method of claim 1, wherein the forming of the first opening is performed by executing instructions stored in a computer readable medium.

8. A method of manufacturing, comprising:
   coupling a solder structure to a first conductor structure of a semiconductor chip, the semiconductor chip including a first dielectric layer positioned over the first conductor structure and a first opening in the first dielectric layer that exposes at least a portion of the first conductor structure and defines an interior wall that includes plural protrusions; and
   whereby the solder structure is coupled to the first conductor structure such that a portion of the solder structure is positioned in the first opening.

9. A method of coupling a semiconductor chip to a circuit board, comprising:
   placing a portion of a first solder structure in a first opening in a first dielectric layer of the semiconductor chip, the first opening leading to at least a portion of a first conductor structure of the semiconductor chip and defining an interior wall that includes plural protrusions; and
   coupling the first solder structure to the circuit board.

10. The method of claim 9, wherein the coupling the first solder structure comprises coupling a second solder structure to the circuit board and thereafter coupling the first solder structure to the second solder structure.

11. The method of claim 9, wherein the circuit board comprises a semiconductor chip package substrate.

12. The method of claim 9, wherein first conductor comprises an input/output pad.

13. The method of claim 9, wherein the first conductor comprises a dummy pad.

14. An apparatus, comprising:
   a semiconductor chip including a first conductor structure and a first dielectric layer on the first conductor structure, the first dielectric layer including a first opening to the first conductor structure defining an interior wall of the first dielectric layer that includes plural protrusions; and
   a solder structure coupled to the first conductor structure such that a portion of the solder structure is positioned in the first opening.

15. The apparatus of claim 14, comprising a second dielectric layer beneath the first dielectric layer that includes a second opening through which the first opening projects.

16. The apparatus of claim 14, comprising a circuit board coupled to the solder structure.

17. The apparatus of claim 14, comprising a second conductor structure on the first conductor structure and coupled to the solder structure.

18. The apparatus of claim 14, wherein the first dielectric layer comprises polyimide.

19. The apparatus of claim 14, wherein the first conductor structure comprises an input/output pad.

20. The apparatus of claim 14, wherein the first conductor structure comprises a dummy pad.

* * * * *